United States Patent
Kim et al.

(10) Patent No.: US 9,927,488 B2
(45) Date of Patent: Mar. 27, 2018

(54) PACKAGE TRANSFER UNIT AND PACKAGE MANAGEMENT APPARATUS INCLUDING THE SAME

(71) Applicant: Samsung Electronics Co., Ltd., Suwon-si, Gyeonggi-do (KR)

(72) Inventors: Youngin Kim, Hwaseong-si (KR); Jungho Kim, Hwaseong-si (KR); Jongsam Kim, Suwon-si (KR); Byung-Soo Park, Hwaseong-si (KR); Sookil Park, Osan-si (KR); Byungkook Yoo, Suwon-si (KR); Seong Sil Jeong, Seoul (KR); Wooseong Choi, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 118 days.

(21) Appl. No.: 14/959,641

(22) Filed: Dec. 4, 2015

(65) Prior Publication Data
US 2016/0202290 A1 Jul. 14, 2016

(30) Foreign Application Priority Data
Jan. 8, 2015 (KR) .................. 10-2015-0002879

(51) Int. Cl.
| G01R 31/28 | (2006.01) |
| G01R 31/26 | (2014.01) |
| H01L 21/67 | (2006.01) |
| H01L 21/68 | (2006.01) |

(52) U.S. Cl.
CPC ................. *G01R 31/2893* (2013.01)

(58) Field of Classification Search
CPC ....... H01L 21/67; H01L 21/68; H01L 21/677; H01L 21/67733; H01L 21/67736; H01L 21/6773; H01L 21/67778; H01L 21/687; H01L 21/67748; G01R 31/28; G01R 31/2893; G01R 31/26; G01R 31/2601; B66C 1/10; B66C 1/66; B66C 19/00
See application file for complete search history.

(56) References Cited

U.S. PATENT DOCUMENTS

| 6,838,892 B2 | 1/2005 | Suzuki |
| 7,541,801 B2 | 6/2009 | Nagasaka et al. |
| 8,493,087 B2 | 7/2013 | Cho et al. |
| 8,829,936 B2 | 9/2014 | Hung et al. |

(Continued)

FOREIGN PATENT DOCUMENTS

| JP | 2004245686 A | 9/2004 |
| JP | 2007165715 A | 6/2007 |

(Continued)

*Primary Examiner* — Arleen M Vazquez
*Assistant Examiner* — Neel Shah
(74) *Attorney, Agent, or Firm* — Harness, Dickey & Pierce, P.L.C.

(57) ABSTRACT

Probe card transfer units and probe card management apparatuses including the same may be provided. The transfer unit includes a hand part including grippers holding a package and a moving part moving the hand part. Each of the grippers includes at least one locking pin protruding from a holding bar, which extends in a direction perpendicular to the holding bar, to securely hold the package.

16 Claims, 20 Drawing Sheets

(56) References Cited

U.S. PATENT DOCUMENTS

| | | | |
|---|---|---|---|
| 2001/0050206 A1* | 12/2001 | Oldford | B62D 65/18 198/341.01 |
| 2005/0079041 A1* | 4/2005 | Campbell | B66C 13/06 414/626 |
| 2010/0065467 A1* | 3/2010 | Murata | H01L 21/67369 206/710 |
| 2011/0037492 A1* | 2/2011 | Seubert | G01R 1/0491 324/756.03 |
| 2012/0223730 A1 | 9/2012 | Yamada | |
| 2012/0263562 A1 | 10/2012 | Mizokawa et al. | |
| 2012/0279415 A1* | 11/2012 | Chen | H01L 21/67733 104/89 |
| 2013/0216336 A1* | 8/2013 | Lee | H01L 21/67733 414/225.01 |
| 2015/0325462 A1* | 11/2015 | Abe | H01L 21/6719 206/710 |

FOREIGN PATENT DOCUMENTS

| | | |
|---|---|---|
| KR | 101019534 B1 | 3/2011 |
| KR | 101019535 B1 | 3/2011 |

* cited by examiner

PACKAGE TRANSFER UNIT AND PACKAGE MANAGEMENT APPARATUS INCLUDING THE SAME

CROSS-REFERENCE TO RELATED APPLICATIONS

This U.S. non-provisional patent application claims priority under 35 U.S.C. § 119 to Korean Patent Application No. 10-2015-0002879, filed on Jan. 8, 2015, the entire contents of which are hereby incorporated by reference.

BACKGROUND

The present disclosure herein relates to probe cards, and more particularly, to package transfer units for transferring a probe card and/or package management apparatuses including the same.

Semiconductor devices may be manufactured through a plurality of unit processes. A test process from among the unit processes is a process for determining reliability of a semiconductor device. A tester may input/output electric signals into/from the semiconductor device through a probe card. The probe card may be connected to the semiconductor device in a wafer level. In general, the probe card is being managed and loaded manually by an operator.

SUMMARY

The present disclosure provides package transfer units which are capable of automatically transferring a package including a probe card and/or a package management apparatuses including the same.

According to an example embodiment of the inventive concepts, a transfer unit may include a hand part including grippers, the grippers configured to hold a package, the grippers including a holding bar configured to support the package, and at least one locking pin protruding from the holding bar to couple the package to the holding bar, a moving part configured to move the hand part and a hoisting part between the hand part and the moving part and configured to ascend or descend the hand part to and from the moving part.

According to another example embodiment of the inventive concepts, a package management apparatus may include a carrier configured to load and unload a package, the package including a probe card and card jig, and a transfer unit configured to transfer the package, the transfer unit including a hand part having grippers configured to hold the card jig, each of the grippers having, a holding bar configured to support the package, and at least one locking pin protruding from the hold bar to couple the package to the holding bar, a moving part configured to move the hand part, and a hoisting part between the hand part and the moving part and configured to ascend or descend the hand part to and from the moving part.

According to still another example embodiment of the inventive concepts, a transfer unit for loading and unloading a card jig, the transfer unit may include a hand part including a hand body and grippers, the grippers protruding from and disposed under the hand body and configured to support the card jig, each of the grippers including, a holding bar having a horizontal bar and vertical bars, and at least one locking pin protruding from the holding bar and configured to be coupled the card jig with the holding bar by inserting the locking pin into a locking hole of the card jig, a moving part configured to move the hand part, and a hoisting part connecting the moving part with the hand part and configured to move the hand part toward and away from the moving part.

BRIEF DESCRIPTION OF THE DRAWINGS

The accompanying drawings are included to provide a further understanding of the inventive concepts, and are incorporated in and constitute a part of this specification. The drawings illustrate some example embodiments of the inventive concepts and, together with the description, serve to explain principles of the inventive concepts. In the drawings.

DETAILED DESCRIPTION OF EXAMPLE EMBODIMENTS

Figure 1:
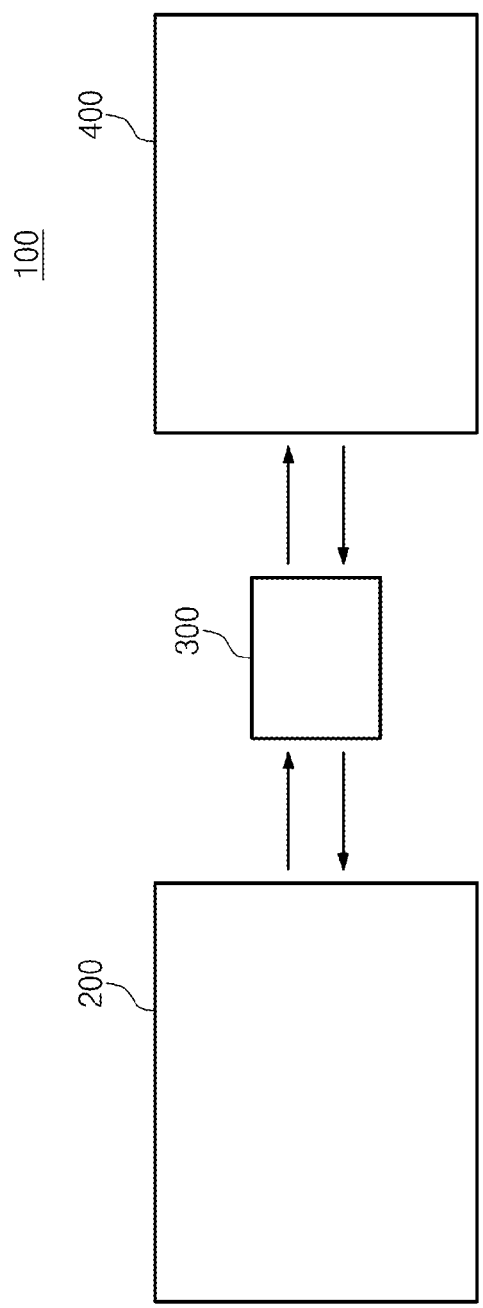
FIG. 1 is a view illustrating an example of a package management apparatus according to an example embodiment of the inventive concepts.

Hereinafter, various exemplary embodiments of the inventive concept will be described in detail with reference to the accompanying drawings. Advantages and features of the present disclosure, and implementation methods thereof will be clarified through following example embodiments described with reference to the accompanying drawings. The disclosure may, however, be embodied in many different forms and should not be construed as being limited to the example embodiments set forth herein. Rather, these example embodiments are provided so that this disclosure will be thorough and complete, and will fully convey the scope of the present inventive concepts to those skilled in the art. Further, the present disclosure is only defined by scopes of claims. Like reference numerals refer to like elements throughout.

In the following description, the technical terms are used only for explaining a specific example embodiment while not limiting the present disclosure. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components. Also, the terms used in the specification may be clearly understood as general mechanical terms related to a probe card, a transfer apparatus, a stocker, a test apparatus, and the like. Since some example embodiments are provided below, the order of the reference numerals given in the description is not limited thereto.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments. It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Expressions such as "at least one of," when preceding a list of elements, modify the entire list of elements and do not modify the individual elements of the list.

FIG. 1 is a view illustrating an example of a package management apparatus 100 according to an example embodiment of the inventive concepts.

Referring to FIG. 1, a package management apparatus 100 may be a probe card management apparatus. According to an example embodiment, the management apparatus 100 may include a storage unit 200, an automatic transfer unit 300, and a test unit 400. The storage unit 200 may be a unit configured to store a package. The storage unit 200 may include, for example, a stocker. The automatic transfer unit 300 may transfer the package between the storage unit 200 and the test unit 400. For example, the automatic transfer unit 300 may include an overhead hoisting transfer. The package may be automatically transferred by the automatic transfer unit 300. The test unit 400 may perform an electrical test of the package. For example, the test unit 400 may perform an electric die sorting (EDS) test of a semiconductor substrate.

Figure 2:
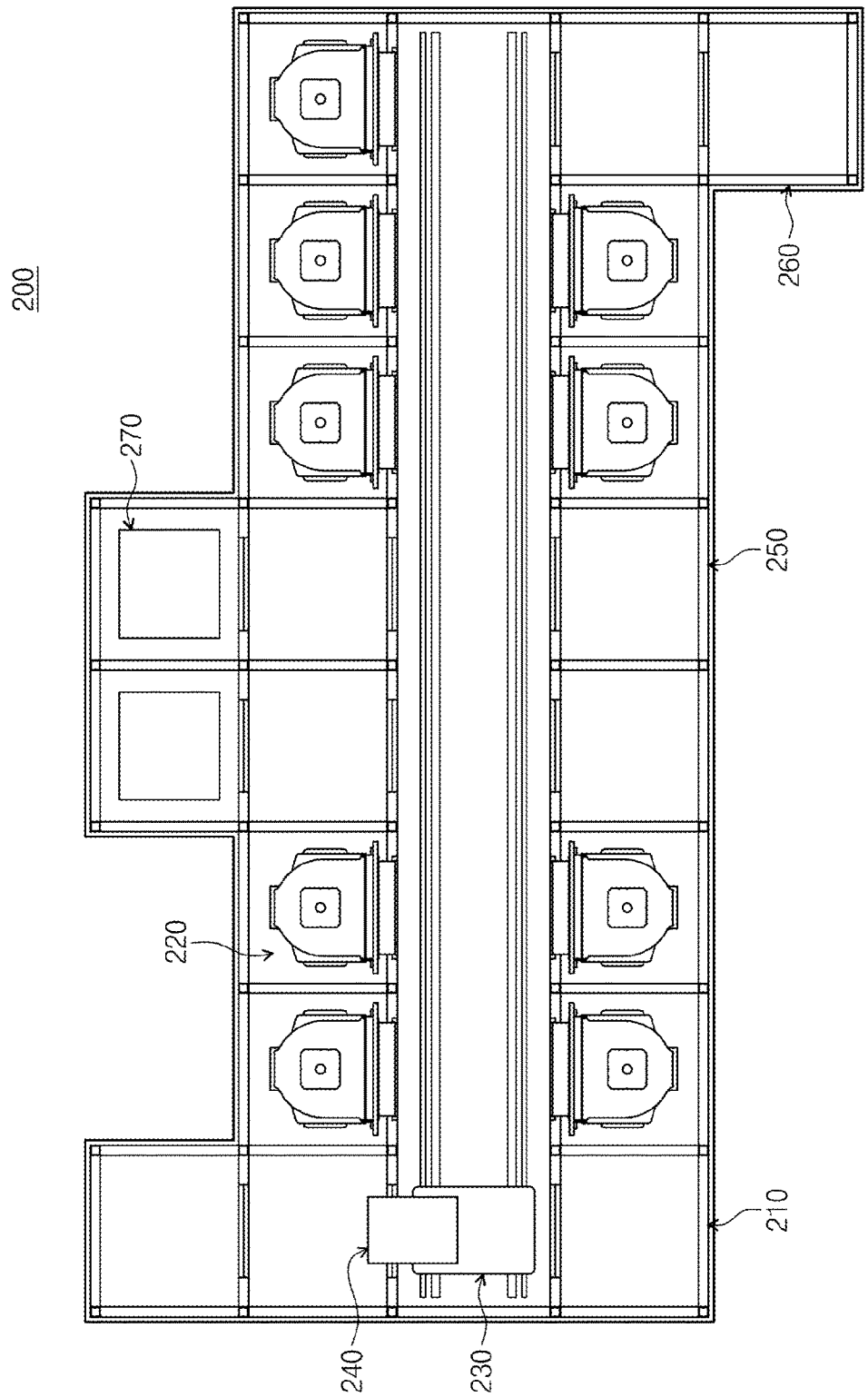
FIG. 2 is a plan view of a storage unit of FIG. 1.

FIG. 2 illustrates the storage unit 200 of FIG. 1.

Referring to FIG. 2, the storage unit 200 may include a stocker housing 210, shelves 220, a crane 230, a fork 240, a manual port 250, a manual transfer port 260, and an automatic transfer port 270. The stocker housing 210 may provide a space independent or isolated from the outside. The inside of the stocker housing 210 may have cleanliness of about class 1,000. The shelves 220, the crane 230, and the fork 240 may be disposed in the stocker housing 210. The shelves 220 may be disposed on both edges of the crane 230. The manual port 250, the manual transfer port 260, and the automatic transfer port 270 may be disposed on an edge of the stocker housing 210. Although not shown, the manual port 250, the manual transfer port 260, and the automatic transfer port 270 may include gates for opening/closing the stocker housing 210.

Figure 3:
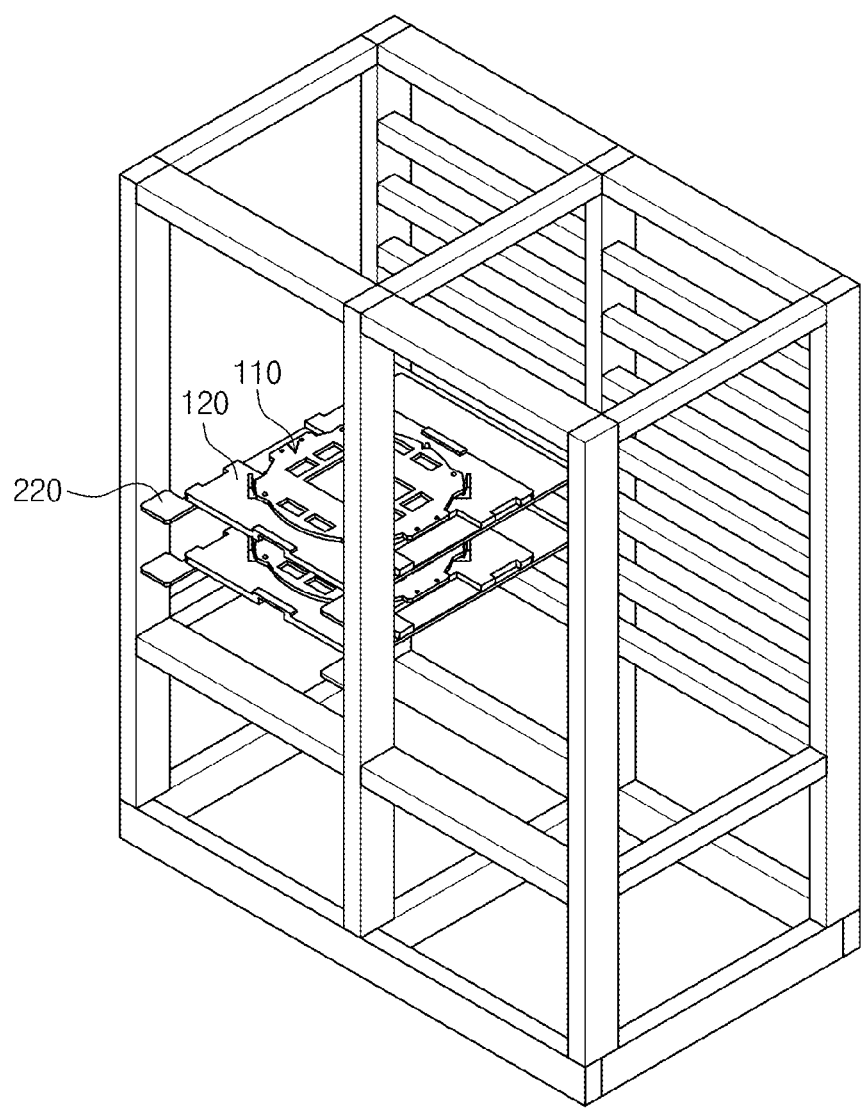
FIG. 3 is a perspective view of shelves of FIG. 2.

FIG. 3 illustrates the shelves 220 of FIG. 2.

Referring to FIG. 3, the selves 220 may store packages 110 and carrier 120. The packages 110 may be loaded on the carriers 120, respectively. Each of the shelves 220 may be wider than each of the package 110 and the carrier 120. The packages 110 and the carrier 120 may be horizontally received by the selves 220. Although not shown, the shelves 220 may include sensors detecting whether the packages 110 and carriers exist and RFID sensors for recognizing kinds of the packages 110.

Figure 4:
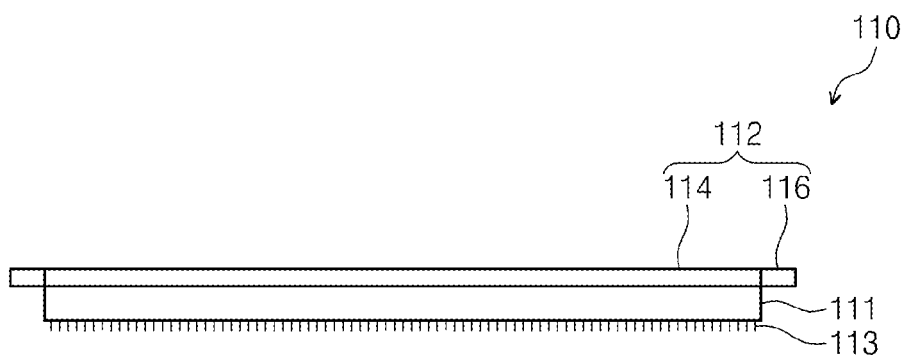
FIGS. 4 and 5 are a cross-sectional view and exploded perspective view of the package of FIG. 3, respectively.
Figure 5:
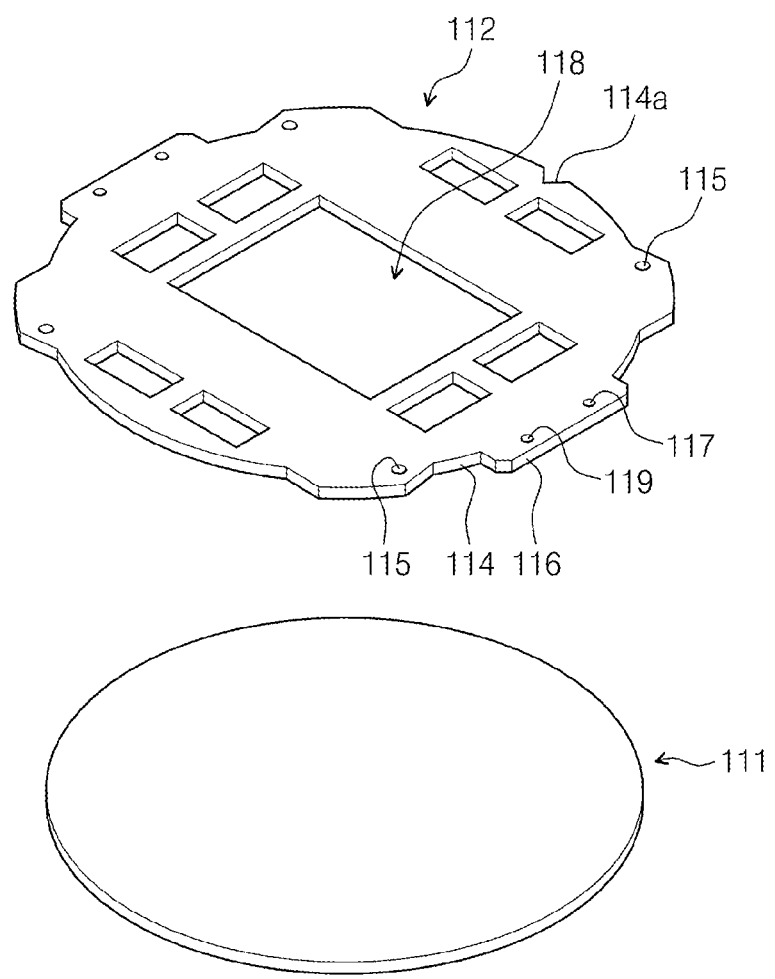

FIGS. 4 and 5 are a cross-sectional view and exploded perspective view illustrating the package 110 of FIG. 3, respectively.

Referring to FIGS. 4 and 5, the package 110 may include a probe card 111 and a card jig 112. The probe card 111 may include a plurality of probe needles 113. The probe needles 113 may be connected to a lower portion of the probe card 111. The probe card 111 may have a weight of about 7 kg to about 20 kg.

The card jig 112 may be attached onto the probe card 111. According to an example embodiment, the card jig 112 may be a stiffener. The card jig 112 may include a bonding part 114 and a support part 116. The bonding part 114 may be a portion to be bonded to the probe card 111. The bonding part 114 may have a plurality of opening holes 118 exposing a top surface of the probe card 111. The support part 116 may be disposed on an edge of the bonding part 114. The bonding part 114 may be disposed to be surrounded by or inside the support part 116. The bonding part 114 may include a direction key 114a. The direction key 114a may have a V-shaped groove.

The support part 116 may include first and second alignment holes 115 and 117 and locking holes 119. The first alignment holes 115 and the locking holes 119 may be disposed at a predetermined distance along the edge of the card jig 112. The second alignment holes 117 and the locking holes 119 may be disposed on both edges of the card jig 112. The second alignment holes 117 and the locking holes 119 may be disposed adjacent to each other.

Figure 6:
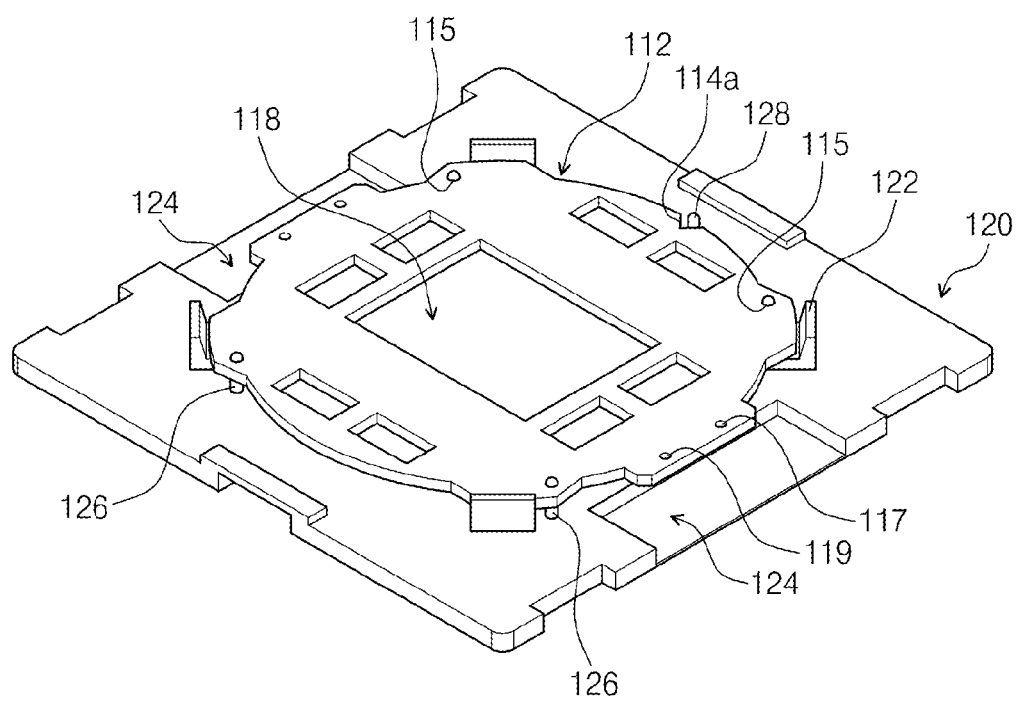
FIG. 6 is a perspective view illustrating an example of the card jig and the carrier of FIGS. 3 to 5.

FIG. 6 illustrates an example of the card jig 112 and the carrier 120 of FIGS. 3 to 5.

Referring to FIGS. 5 and 6, the card jig 112 may be loaded on the carrier 120. The carrier 120 may include a guide slots 122, grooves 124, and first and second alignment pins 126 and 128.

The guide slots 122 may be disposed along the edge of the card jig 112. The guide slots 122 may confine the card jig 112 on the carrier 120. The guide slots 122 may be disposed in the same shape as the card jig 112. When the card jig 112 has a circular shape, the guide slots 122 may be disposed in a circular shape.

The grooves 124 may be formed on both edges of the carrier 120 to face each other. Grippers (see reference numeral 350 of FIG. 16) of the automatic transfer unit 300 may be disposed in the grooves 124.

The first alignment pins 126 may be disposed adjacent to the guide slots 122. The first alignment pins 126 may be disposed in the first alignment holes 115 of the card jig 112. The first alignment pins 126 and the first alignment holes 115 may align the carrier 120 with the card jig 112. The second alignment pin 128 may be coupled to the direction key 114a of the card jig 112. The second alignment pin 128 may determine a direction of the card jig 112. Although not shown, the probe card 111 may be disposed between the card jig 112 and the carrier 120. The probe card 111 may be disposed to be spaced apart from the carrier 120.

Figure 7:
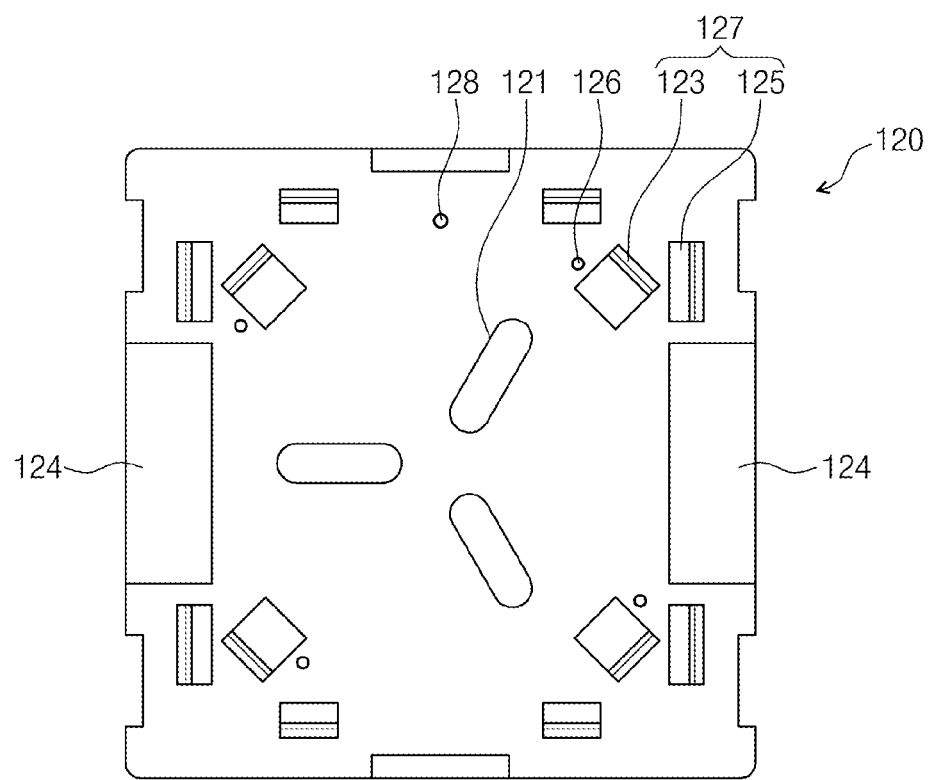
FIG. 7 is a plan view illustrating another example of the carrier of FIG. 6.

FIG. 7 illustrates another example of the carrier 120 of FIG. 6.

Referring to FIGS. 5 and 7, the carrier 120 may have kinematic holes 121. The kinematic holes 121 may be defined in a center of the carrier 120. Each of the kinematic holes 121 may have a size and shape correspond to a standard of the automatic transfer unit 300. For example, three kinematic holes 121 may be provided.

The carrier 120 may accommodate various kinds of card jigs 112. Guide slots 127 of the carrier 120 may include first guide slots 123 and second guide slots 125. The first guide slots 123 may be disposed in a circular shape. The first guide slots 123 may be disposed inside the second guide slots 125. The second guide slots 125 may be disposed in a rectangular shape. Although not shown, the first guide slots 123 may be lower than the second guide slots 125, thereby preventing minimizing the card jig 112 and the probe card 111 from being damage when the card jig 112 and the probe card 111 are confined by the second guide slots 125.

Figure 8:
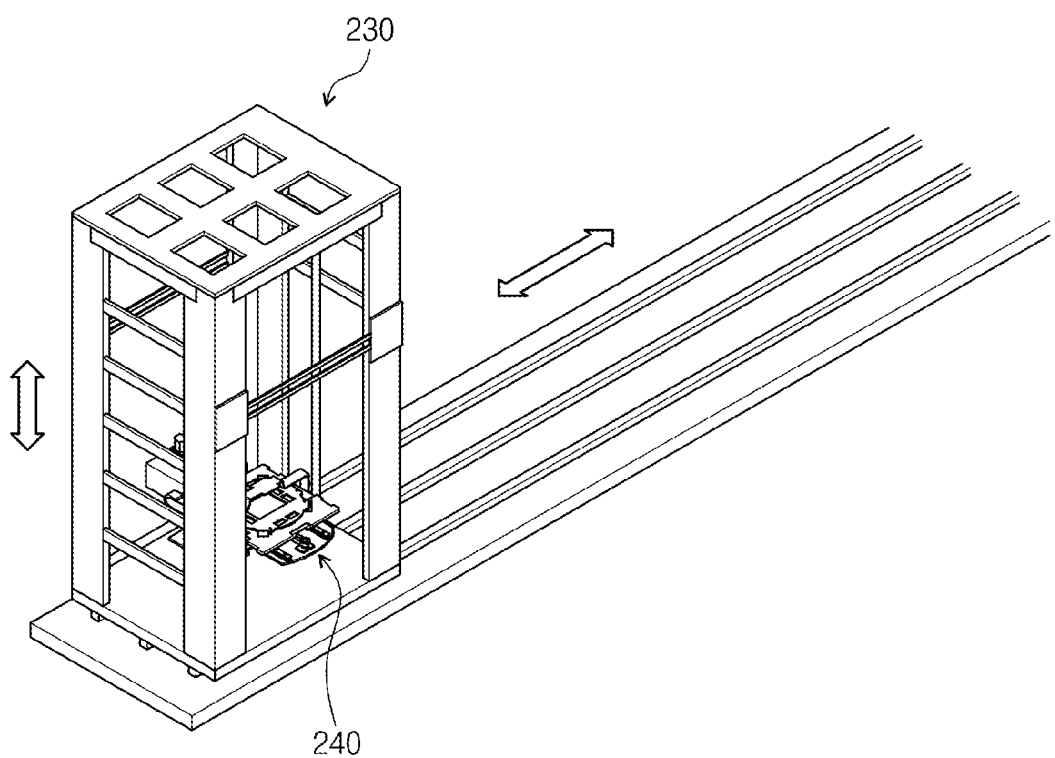
FIGS. 8 and 9 are perspective views illustrating the crane and the fork of FIG. 2, respectively.
Figure 9:
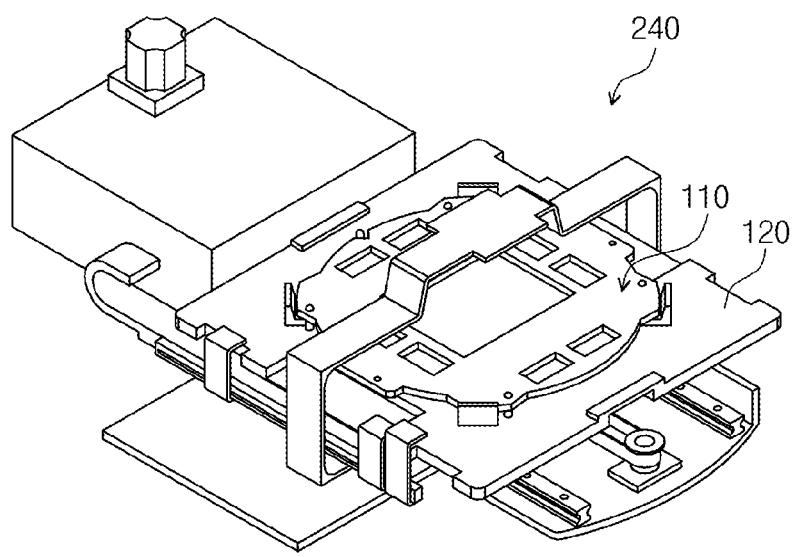

FIGS. 8 and 9 illustrate the crane 230 and the fork 240 of FIG. 2.

Referring to FIGS. 2, 8, and 9, the crane 230 and the fork 240 may provide the package 110 and the carrier 120 onto the shelves 220. The crane 230 may move along a space between the shelves 220. The fork 240 may be disposed in the crane 230. The packages 110 and the carrier 120 may be loaded on the fork 240. The crane 230 may elevate the fork 240. The fork 240 may load the package 110 and the carrier 120 on the shelves 220. On the other hand, the fork 240 may unload the package 110 and the carrier 120 from the shelves 220.

Figure 10:
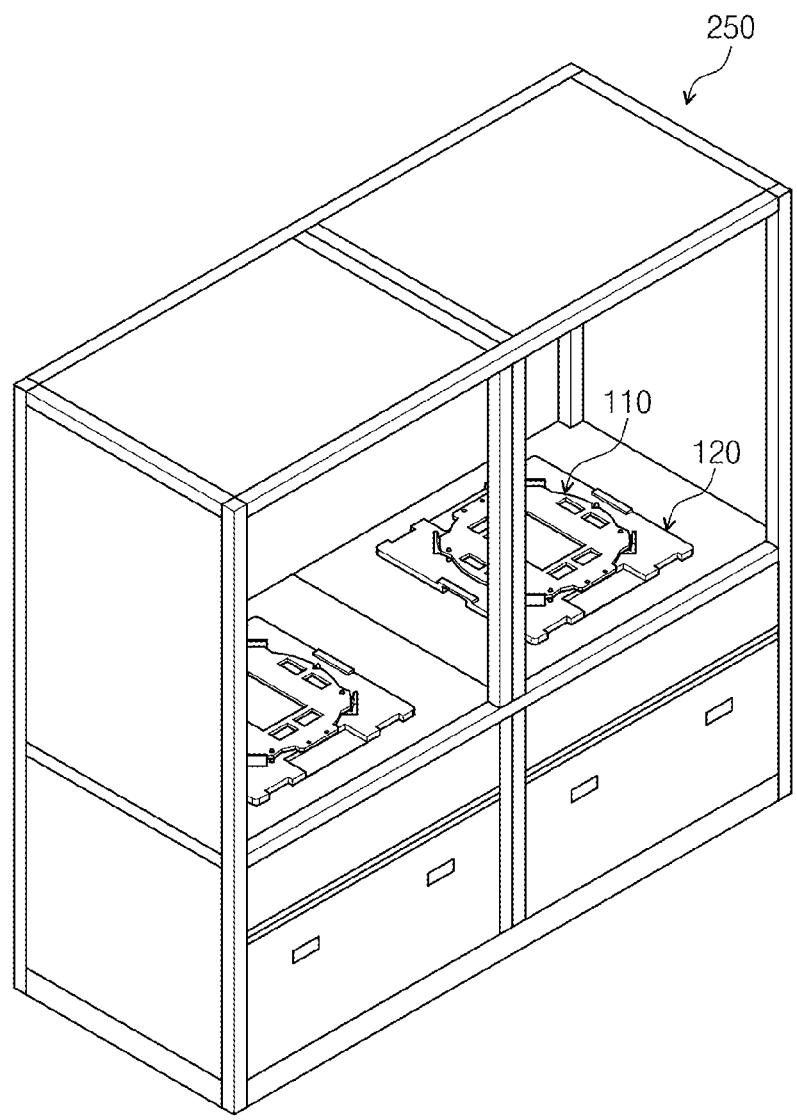
FIG. 10 is a perspective view of the manual port of FIG. 2.

FIG. 10 illustrates the manual port 250 of FIG. 2.

Referring to FIGS. 8 to 10, the manual port 250 may be a port in which the package 110 and the carrier 120 are treated by an operator (not shown). The crane 230 and the fork 240 may provide the package 110 and the carrier 120 to the manual port 250. Thereafter, the package 110 and the carrier 120 within the manual port 250 may be transferred to the outside by the operator. On the other hand, the package 110 and the carrier 120 may be provided into the manual port 250 by the operator. The crane 230 and the fork 240 may transfer the package 110 and the carrier 120 from the manual port 250 to the shelves 220. Although not shown, the sensors for detecting whether the packages 110 and carriers exist and the RFID sensors for recognizing kinds of the package 110 may be disposed in the manual port 250. Also, the manual port 250 may include an air shower apparatus.

Figure 11:
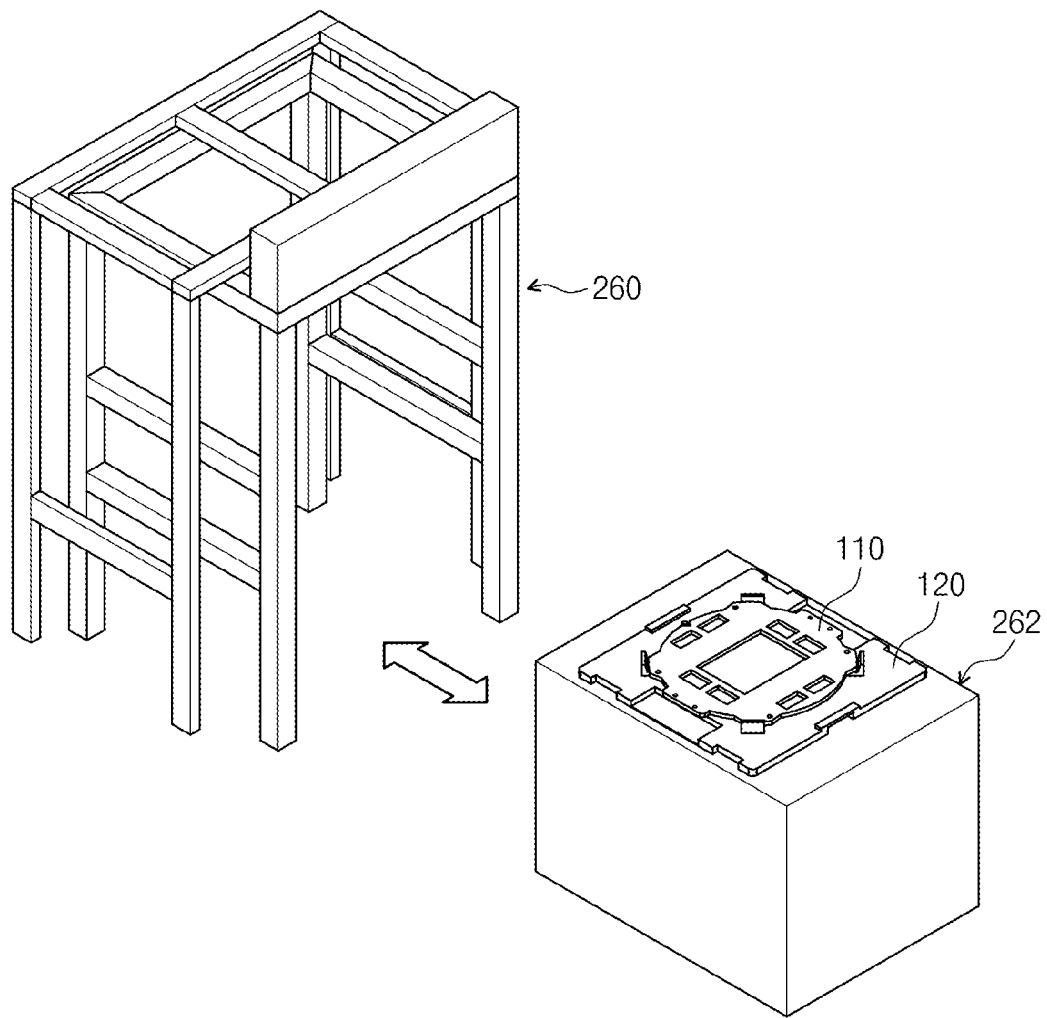
FIG. 11 is a perspective view of the manual transfer port and a manual transfer unit of FIG. 2.

FIG. 11 illustrates the manual transfer port 260 and a manual transfer unit of FIG. 2.

Referring to FIGS. 8, 9, and 11, the manual transfer port 260 may be a port in which the package 110 and the carrier 120 are transferred by a manual transfer unit 262. The manual transfer unit 262 may load the package 110 and the carrier 120 thereon and transfer to the manual transfer port 260. The crane 230 and the fork 240 may provide the package 110 and the carrier 120 in the manual transfer port 260 to the shelves 220. Although not shown, sensors detecting whether the package 110 and carriers exist or not and RFID sensors for recognizing kinds of the package 110 may be disposed in the manual transfer port 260 and the manual transfer unit 262, respectively. Also, the manual transfer port 260 may include an air shower apparatus.

Figure 12:
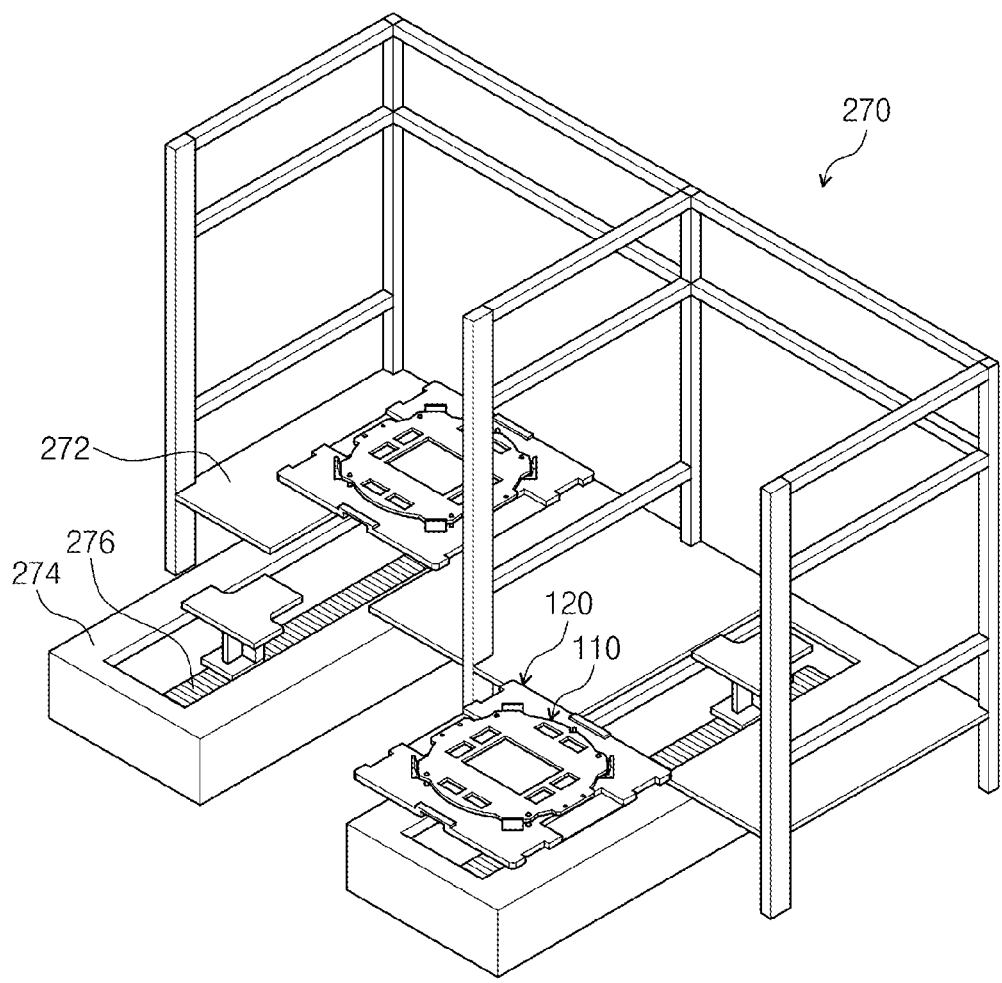
FIG. 12 is a perspective view of the automatic transfer port of FIG. 2.
Figure 13:
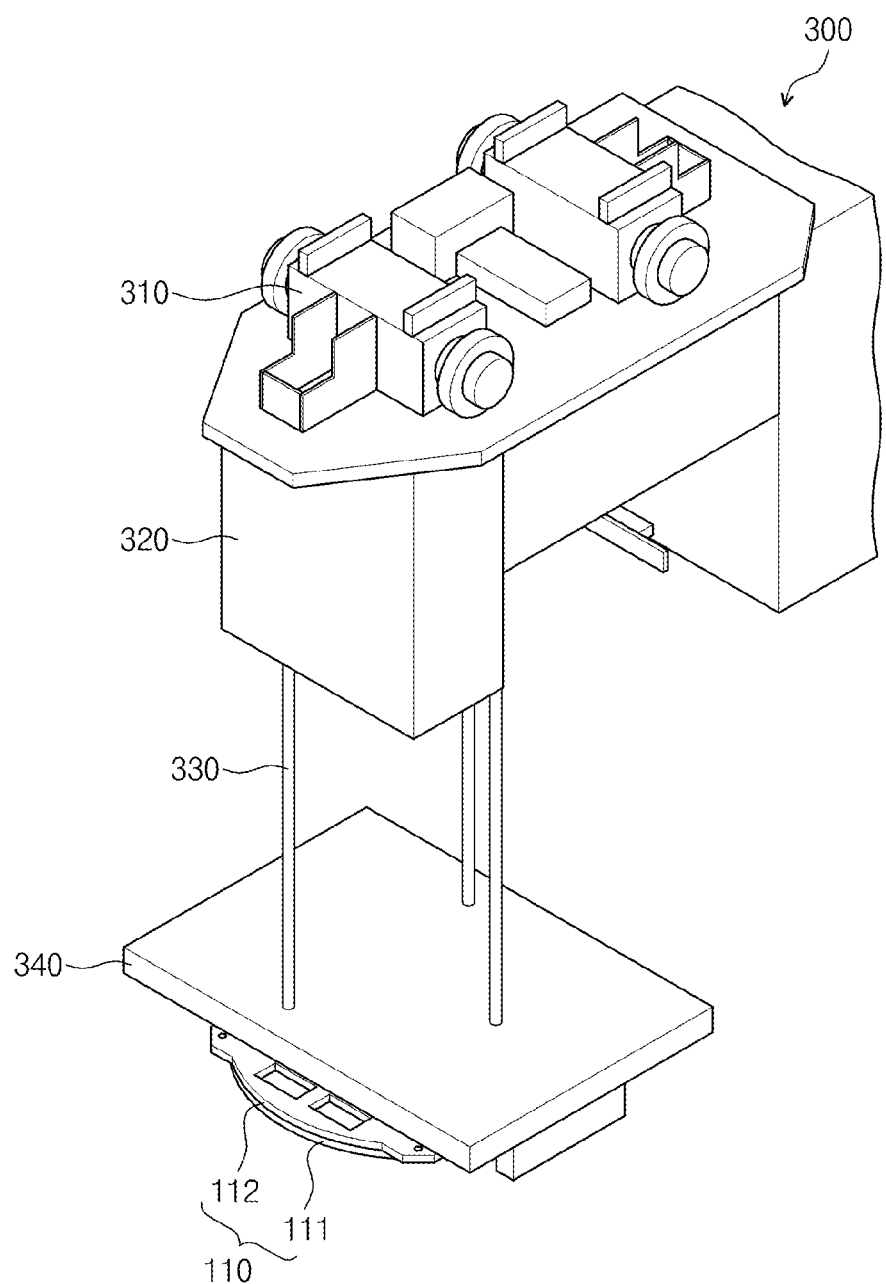
FIG. 13 is a perspective view of the automatic transfer unit of FIG. 1.

FIG. 12 illustrates the automatic transfer port 270 of FIG. 2. FIG. 13 illustrates the automatic transfer unit 300 of FIG. 1.

Referring to FIGS. 2, 3, 12, and 13, the automatic transfer port 270 may be a port for providing the package 110 to the automatic transfer unit 300. The automatic transfer port 270 may include inner stages 272 and outer stages 274. The inner stages 272 may be connected to the stocker housing 210. The outer stages 274 may be disposed outside the stocker housing 210. The inner stages 272 and the outer stages 274 may be connected to each other by a saddle 276. The saddle 276 may transfer the carrier 120 between the inner stages 272 and the outer stages 724. The automatic transfer unit 300 may unload the probe card 111 and the card jig 112 from the outer stage 274. On the other hand, the automatic transfer unit 300 may load the probe card 111 and the card jig 112 onto the outer stage 274. Although not shown, sensors for detecting whether the package 110 and carriers exist and the RFID sensors for recognizing kinds of the packages 110 may be disposed in the automatic transfer port 270. The automatic transfer port 270 may include an air shower apparatus.

Referring to FIG. 13, the automatic transfer unit 300 may include a moving part 310, a hoisting part 320, and a hand part 340. The moving part 310 may move the hoisting part 320 and the hand part 340. The hoisting part 320 may be disposed between the moving part 310 and the hand part 340. The hoisting part 320 may elevate the hand part 340 to the moving part 310. The hoisting part 320 may include lifting lines 330. The hand part 340 may hold the probe card 111 and the card jig 112. Although not shown, the moving part 310 may include at least one sensor and a cushion. The sensor may detect an object approaching the moving part 310. The cushion may buffer an impact generated when the automatic transfer unit 300 collides with the object.

Figure 14:
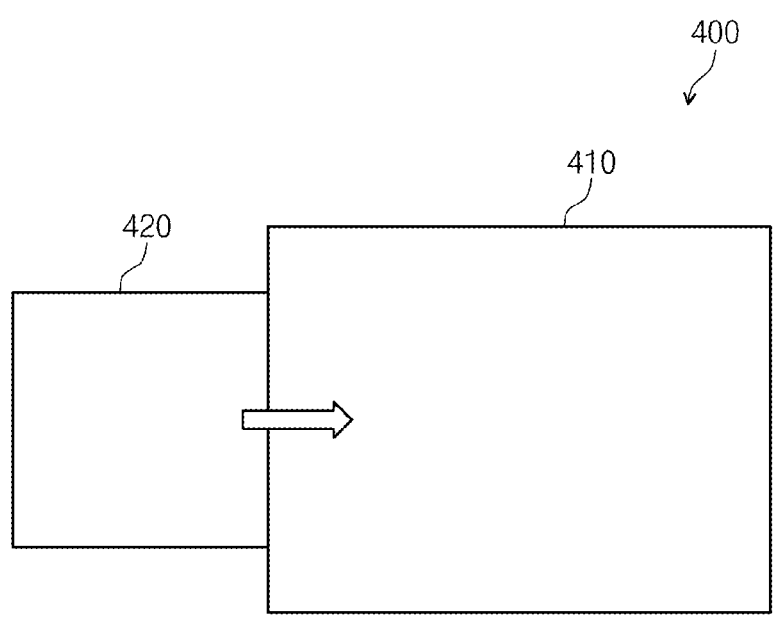
FIG. 14 is a plan view of the test unit of FIG. 1.

FIG. 14 illustrates the test unit 400 of FIG. 1.

Referring to FIGS. 5 and 14, the test unit 400 may include a tester 410 and a load port 420. The tester 410 may perform an electrical test of a semiconductor substrate (not shown) by using the probe card 111. The electrical test may include an EDS test. The tester 410 may be connected to the probe card 111 through the opening hole 118 defined in the card jig 112. The load port 420 may provide the probe card 111 into the tester 410. On the contrary, the load port 420 may unload the probe card 111 in the tester 410 to the outside.

Figure 15:
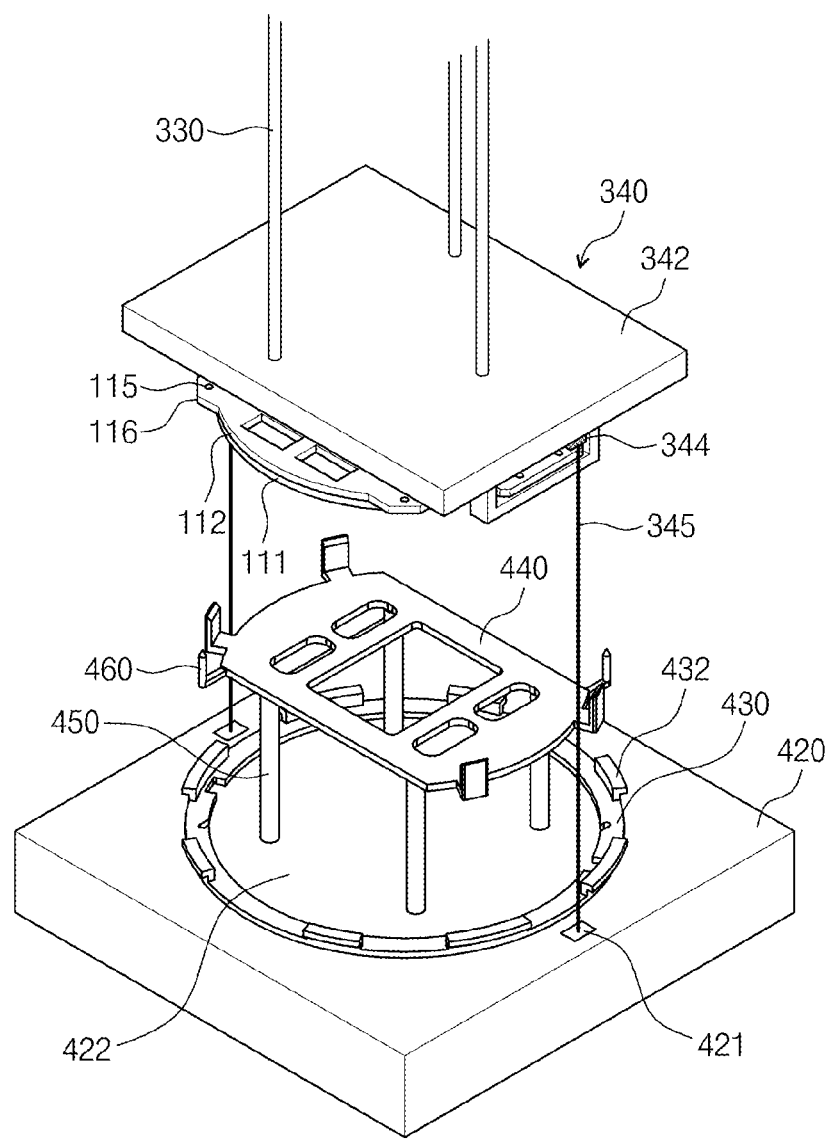
FIG. 15 is a perspective view of the transfer unit and the load port of FIGS. 13 and 14.

FIG. 15 illustrates a portion of the automatic transfer unit 300 and the load port 420 of FIGS. 13 and 14.

Referring to FIG. 15, the hand part 340 may transfer the probe card 111 and the card jig 112 onto the load port 420. A location alignment sensor 344 and a reflection plate 421 may optically align the hand part 340 with the load port 420 by using a laser beam 345. The probe card 111 and the card jig 112 may be disposed between the hand part 340 and the load port 420.

According to an example embodiment, the load port 420 may include a port hole 422, a guide ring 430, a chuck 440, lift pins 450, and third alignment pins 460. The port hole 422 may be defined in a center of the load port 420.

The guide ring 430 may be disposed on an inner wall of the port hole 422. The guide ring 430 may include guide slots 432. The guide slots 432 may support the card jig 112. The guide slots 432 may be aligned with the support part 116 of the card jig 112.

The chuck 440 may be disposed in the port hole 422. The chuck 440 may support the probe card 111. The probe card 111 and the card jig 112 may be disposed between the chuck 440 and the hand part 340.

The lift pins 450 may be disposed in the port hole 422. The lift pins 450 may be disposed below the chuck 440 and be adjacent to the third alignment pins 460. The lift pins 450 may elevate the chuck 440.

The third alignment pins 460 may be disposed on an edge of the chuck 440. The third alignment pins 460 may align the card jig 112 on the chuck 440. The third alignment pins 460 may be inserted into to the first alignment holes 115.

Figure 16:
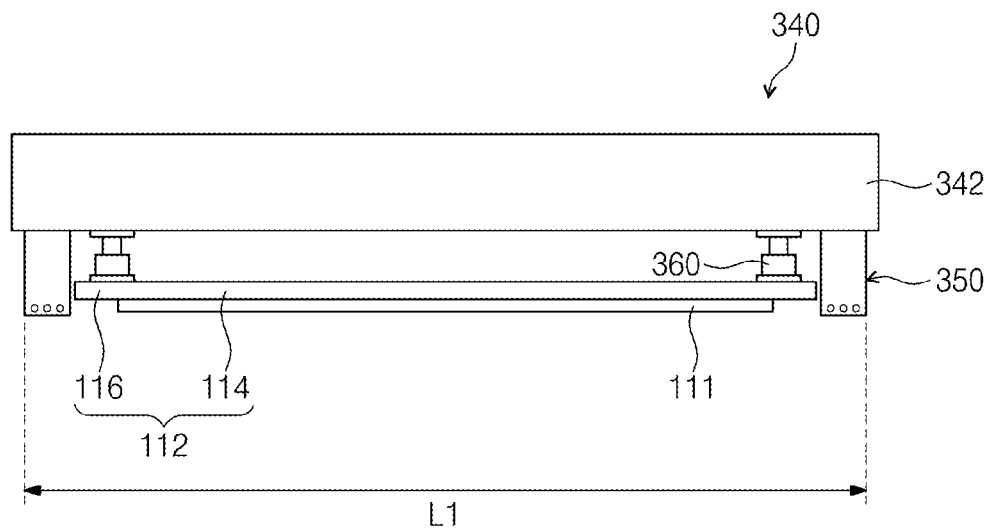
FIGS. 16 and 17 are side views illustrating an example of a process of holding a card jig using grippers.
Figure 17:
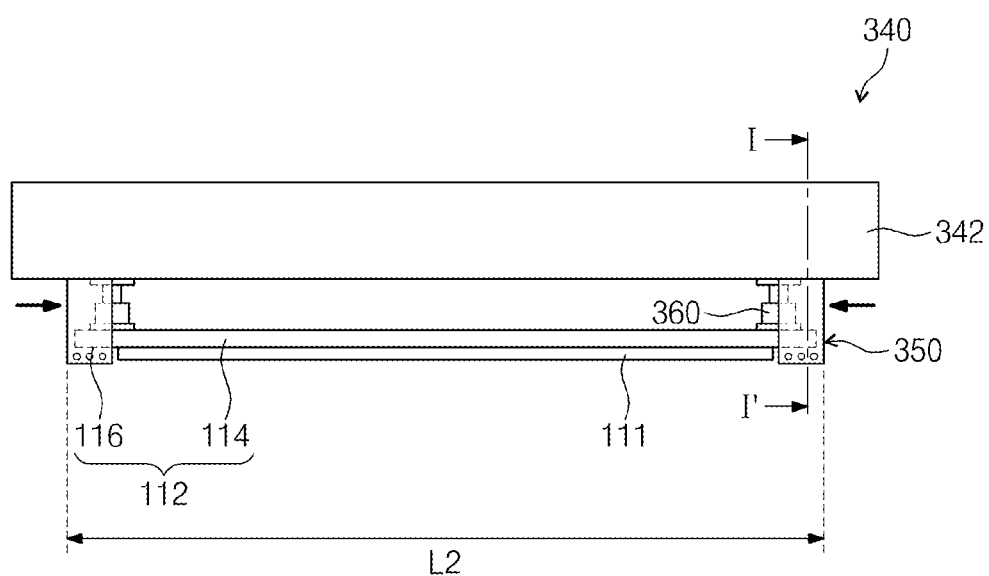

FIGS. 16 and 17 illustrate an example of a process of holding the card jig 112 using grippers 350.

Referring to FIG. 16, the hand part 340 may include a hand body 342, grippers 350, and at least one sensor 360. The hand body 342 may be coupled to the grippers 350. The grippers 350 may be disposed below the hand body 342. The grippers 350 may be protruded from a bottom surface of the hand body 342. The grippers 350 may be disposed to be spaced apart from each other and be disposed at both sides of the hand body 342. The grippers 350 may support both edges of the card jig 112. The hand part 342 may be parallel to the card jig 112 and the probe card 111 between the grippers 350. When the grippers 350 are spaced a maximum distance L1 from each other, the hand part 340 may release the card jig 112.

Referring to FIG. 17, when the grippers 350 approach each other to a distance L2, the hand part 340 may hold the card jig 112. The grippers 350 may move along a bottom surface of the hand body 342. For example, the grippers may horizontally move. The card jig 112 may include a bonding part 114 and a supporting part 116. The sensor 360 may be disposed between the grippers 350. According to an example embodiment, the sensor 360 may include a push sensor. The probe card 111 may be disposed below the bonding part 114. The sensor 360 may detect whether the card jig 112 and the hand part 340 are coupled to each other without contacting the probe card 111. For example, the sensor 360 may push the card jig 112 between the grippers 350. When the card jig 112 is attached to the grippers 350, the hand body 342 and the card jig 112 may be maintained at a desired (or alternatively, predetermined) distance. The sensor 360 may detect a coupled state between the card jig 112 and the hand part 340. On the contrary, when the grippers 350 are separated from the card jig 112, the sensor 360 may detect the separated state between the hand part 340 and the card jig 112.

Figure 18:
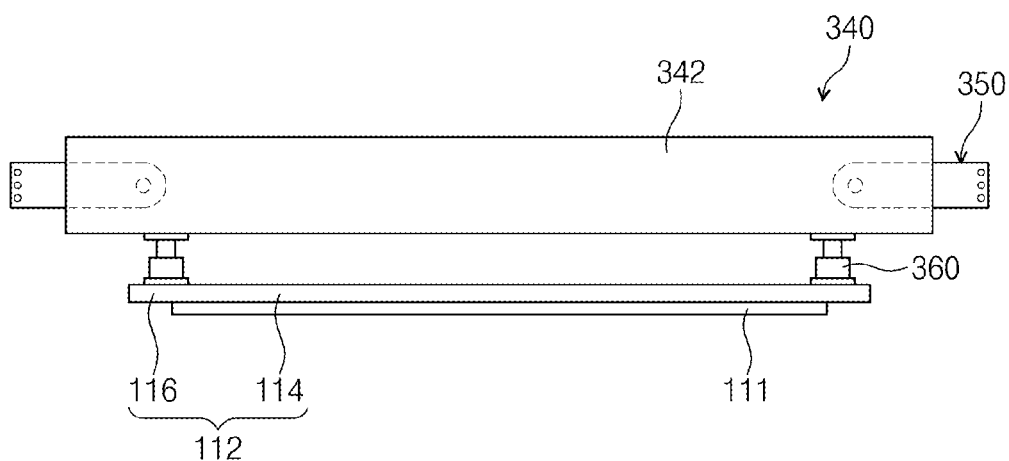
FIGS. 18 and 19 are side views illustrating another example of the process of holding the card jig using grippers.
Figure 19:
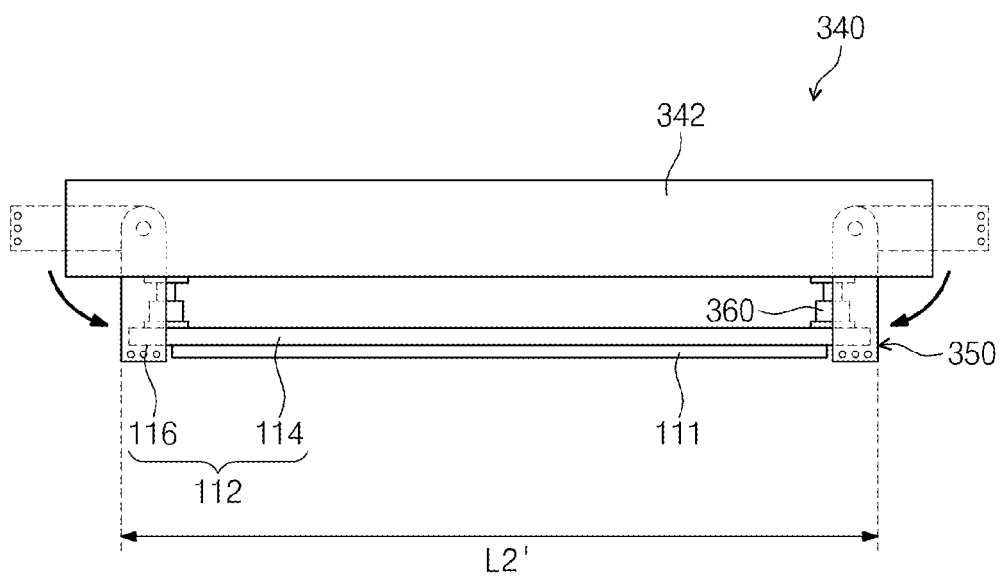

FIGS. 18 and 19 illustrate another example of the process of holding the card jig 112 using the grippers 350.

Referring to FIG. 18, the grippers 350 may be disposed on both sides of the hand body 342. The grippers 350 may be disposed to face each other.

Referring to FIG. 19, the grippers 350 may rotate to a bottom of the card jig 112 under both edges of the hand body 342. The grippers 350 may have a rotation center which is defined within the hand body 342. The grippers 350 may approach each other to a distance L2'. The grippers 350 may hold the card jig 112. On the other hand, the grippers 350 may rotate from the bottom of the card jig 112 to the both edges of the hand body 342, thereby releasing the card jig 112.

Figure 20:
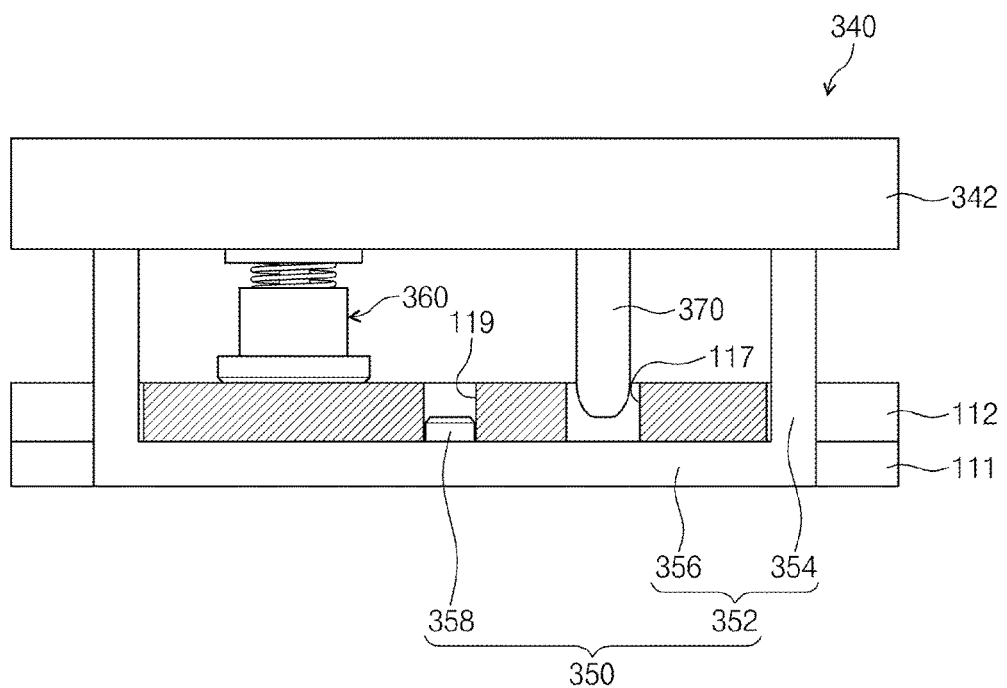
FIG. 20 is a cross-sectional view taken along line I-I' of FIG. 17.

FIG. 20 is a cross-sectional view taken along line I-I' of FIG. 17.

Referring to FIG. 20, each of the grippers 350 may include holding bar 352 and a locking pin 358. The holding bar 352 may support the card jig 112. For example, the holding bar 352 may have a U shape. According to an example embodiment, the holding bar 352 may include vertical portions 354 and a horizontal portion 356. The vertical portions 354 may vertically protrude from an edge of the horizontal portion 336. The vertical portions 354 may be coupled to the hand body 342. A deviant crease lined area of FIG. 20 represents a cross-sectional portion of the card jig 112 on the horizontal portion 356.

The locking pin 358 may be disposed on or protrude from the horizontal portion 356. The locking pin 358 may be inserted into the locking hole 119 of the card jig 112. The locking pin 358 may be a gripper safety pin for mitigating or preventing the grippers 350 from falling down. The locking pin 358 may have a height of about 7 mm from the horizontal portion 356.

The hand part 340 may include a fourth alignment pin 370. The fourth alignment pin 370 may be connected to the hand body 342 or may protrude from the hand body 342. The fourth alignment pin 370 may be disposed in the same direction as the locking pin 358. The second alignment holes 117 and the locking holes 119 may be disposed adjacent to each other in the same direction. The fourth alignment pin 370 and the locking pin 358 may be disposed to be misaligned with each other. The fourth alignment pin 370 may be disposed between the vertical portions 354. The fourth alignment pin 370 may be inserted into the second alignment hole 117 of the card jig 112. The fourth alignment pin 370 may align the card jig 112.

Figure 21:
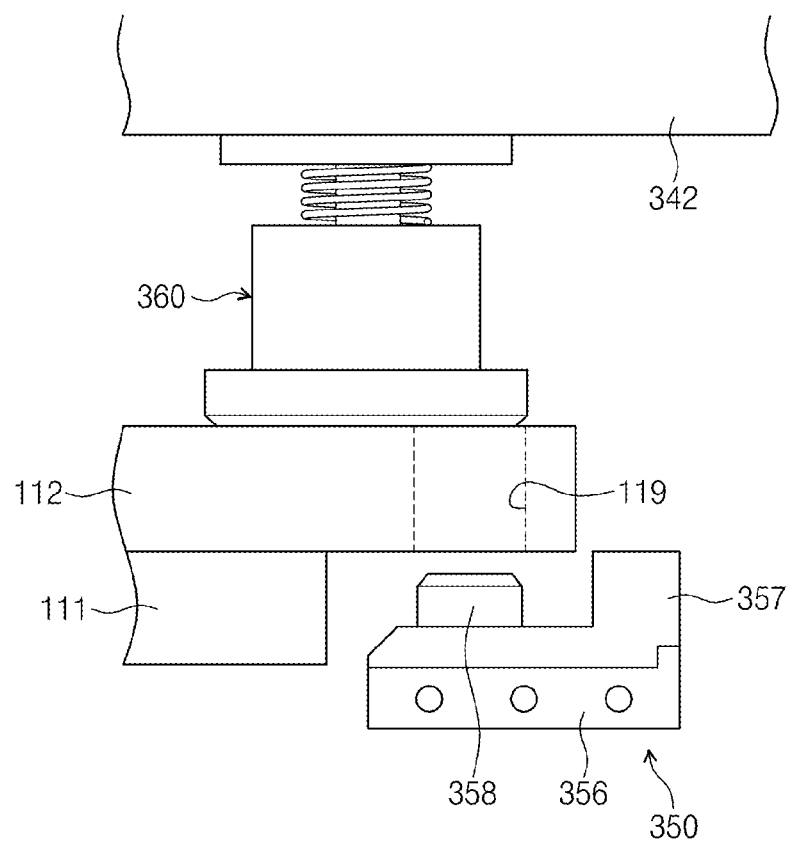
FIGS. 21 and 22 are partial cross-sectional views illustrating a process of coupling a locking pin to a locking hole.
Figure 22:
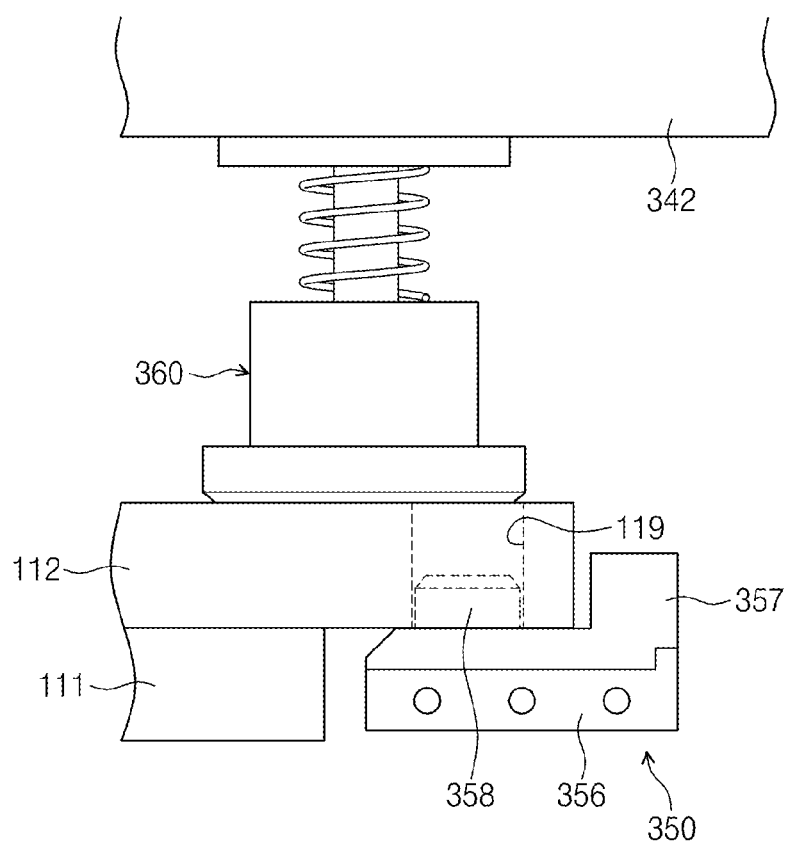

FIGS. 21 and 22 illustrate a process of coupling the locking pin 358 to the locking hole 119.

Referring to FIGS. 1, 21, and 22, the horizontal portion 356 may include a step guide wall 357. The step guide wall 357 may be higher than the locking pin 358. The sensor 360 may detect a distance between the hand body 342 and the card jig 112. The card jig 112 may be loaded onto the horizontal bar 356 along the step guide wall 357. Thereafter, the locking pin 358 may be inserted into the locking hole 119 of the card jig 112. The card jig 112 may be attached to the gripper 350 in a horizontal direction. When the card jig 112 and the probe card 111 horizontally move by the automatic transfer unit 300, the locking pin 358 may attached the card jig 112 onto the horizontal portion 356.

As described above, according to an example embodiment of the inventive concepts, the package management apparatus may include the storage unit, the automatic transfer unit, and the test unit. The automatic transfer unit may transfer the probe card between the storage unit and the test unit. The probe card may be automatically transferred by the automatic transfer unit.

The description of the present invention is intended to be illustrative, and those with ordinary skill in the technical field of the present inventive concepts will be understood that the present inventive concepts can be carried out in other specific forms without changing the technical idea or essential features. Therefore, the example embodiments described above are merely example in all respects and not restrictive.

What is claimed is:

1. A transfer unit for loading and unloading a package, the transfer unit comprising:
   a hand part including grippers and a hand body coupled to the grippers, the grippers configured to hold the package, the grippers including,
      a holding bar configured to support the package, the holding bar including,
         first portions connected to a lower portion of the hand body and disposed in a first direction perpendicular to the hand body, and
         a second portion between the first portions and configured to support the package, the second portion being in a second direction perpendicular to the first direction, the second portion including a step guide wall onto which an edge of the package is to be loaded, and
      at least one locking pin; protruding from the second portion of the holding bar and configured to couple the package to the holding bar;
   a moving part configured to move the hand part; and
   a hoisting part between the hand part and the moving part and configured to ascend or descend the hand part to and from the moving part.

2. The transfer unit of claim 1, wherein the grippers are configured to at least one of approach each other to a distance along a lower part of the hand body or rotate downward from both edges of the hand body to hold the package.

3. The transfer unit of claim 1, wherein the locking pin is lower than the step guide wall.

4. The transfer unit of claim 1, wherein the hand part is between the first portions.

5. A package management apparatus comprising:
   a carrier configured to load and unload a package, the package including a probe card and card jig; and
   a transfer unit configured to transfer the package, the transfer unit including,
      a hand part having grippers configured to hold the card jig and a hand body coupled to the grippers, each of the grippers having,
         a holding bar configured to support the package, the holding bar including,
            first portions connected to the hand body and disposed in a first direction perpendicular to the hand body; and
            a second portion between the first portions and configured to support the package, the second portion being in a second direction perpendicular to the first direction, the second portion including a step guide wall onto which an edge of the package is to be loaded, and
         at least one locking pin protruding from the second portion of the holding bar and configured to couple the package to the holding bar,
      a moving part configured to move the hand part, and
      a hoisting part between the hand part and the moving part and configured to ascend or descend the hand part to and from the moving part.

6. The package management apparatus of claim 5, wherein the card jig comprises a locking hole configured to receive the locking pin.

7. The package management apparatus of claim 6, wherein the grippers is configured to hold the card jig when the grippers approach each other to a distance, and the locking pin is provided in the locking hole.

8. The package management apparatus of claim 5, wherein the hand part further comprises an alignment pin protruding from the hand body and provided between the first portions, and the card jig comprises an alignment hole into which the alignment pin is to be inserted.

9. The package management apparatus of claim 5, wherein the carrier comprises a plurality of slots configured to accommodate the card jig, and each of the slots includes
   first slots arranged in a circular shape and configured to accommodate the card jig having a circular shape; and
   second slots arranged in a rectangular shape outside the first slots, being higher than the first slots, and configured to accommodate the card jig having a rectangular shape.

10. The transfer unit of claim 5, wherein the locking pin is lower than the step guide wall.

11. A transfer unit for loading and unloading a card jig, the transfer unit comprising:
    a hand part including a hand body and grippers, the grippers protruding froth and disposed under the hand body and configured to support the card jig, each of the grippers including,
       a holding bar having a horizontal portion and vertical portions, the horizontal portion including a step guide wall onto which an edge of a card jig is to be loaded, and
       at least one locking pin protruding from the holding bar and configured to couple the card jig with the holding bar by inserting the locking pin into a locking hole of the card jig;
    a moving part configured to move the hand part; and
    a hoisting part connecting the moving part with the hand part and configured to move the hand part toward and away from the moving part.

12. The transfer unit of claim 11, wherein the hand part further includes an alignment pin protruding downward from the hand body, and the alignment pin is configured to couple the card jig to the hand part by inserting the alignment pin into an alignment hole of the card jig.

13. The transfer unit of claim 12, wherein the locking hole of the card jig and the alignment hole of the card jig are in a same direction and adjacent to each other.

14. The transfer unit of claim 12, wherein the locking pin and the alignment pin are in a same direction.

15. The transfer unit of claim 11, wherein the horizontal portion and the vertical portions of the holding bar form a U-shape.

16. The transfer unit of claim 11, wherein the locking pin is lower than the step guide wall.

\* \* \* \* \*